US009805799B2

(12) United States Patent
Lee et al.

(10) Patent No.: US 9,805,799 B2
(45) Date of Patent: Oct. 31, 2017

(54) DEVICES AND METHODS OF MANAGING NONVOLATILE MEMORY DEVICE HAVING SINGLE-LEVEL CELL AND MULTI-LEVEL CELL AREAS

(71) Applicant: SAMSUNG ELECTRONICS CO., LTD., Suwon-si, Gyeonggi-do (KR)

(72) Inventors: Joon-Ho Lee, Hwaseong-si (KR); Gwang-Ok Go, Suwon-si (KR); Kyung-Ho Shin, Seongnam-si (KR); Mi-Hyang Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 197 days.

(21) Appl. No.: 13/786,501

(22) Filed: Mar. 6, 2013

(65) Prior Publication Data
US 2014/0003142 A1    Jan. 2, 2014

(30) Foreign Application Priority Data

Jun. 29, 2012 (KR) .................. 10-2012-0071372

(51) Int. Cl.
```
G06F 12/00      (2006.01)
G11C 16/10      (2006.01)
G06F 12/02      (2006.01)
```
(52) U.S. Cl.
CPC .......... *G11C 16/10* (2013.01); *G06F 12/0246* (2013.01); *G06F 12/0253* (2013.01); *G06F 2212/7205* (2013.01)

(58) Field of Classification Search
CPC . G06F 12/023; G06F 12/0253; G06F 12/0269
USPC ........ 711/103, 134, 145, 152, 165; 707/817, 707/818; 714/710; 365/82, 131, 173, 365/210.14
See application file for complete search history.

(56) References Cited

U.S. PATENT DOCUMENTS

| | | | |
|---|---|---|---|
| 5,404,485 A | | 4/1995 | Ban |
| 6,938,116 B2 * | | 8/2005 | Kim et al. .................. 711/103 |
| 7,783,851 B2 * | | 8/2010 | Im et al. ..................... 711/165 |
| 8,788,778 B1 * | | 7/2014 | Boyle ......................... 711/165 |
| 8,886,877 B1 * | | 11/2014 | Avila et al. ................. 711/103 |
| 8,966,205 B1 * | | 2/2015 | Lo ...................... G06F 12/0246 |
| | | | 711/165 |

(Continued)

FOREIGN PATENT DOCUMENTS

| | | |
|---|---|---|
| JP | 2003-044351 | 2/2003 |
| KR | 0994052 | 11/2010 |

(Continued)

*Primary Examiner* — Reba I Elmore
(74) *Attorney, Agent, or Firm* — Volentine & Whitt, PLLC

(57) ABSTRACT

A nonvolatile memory device includes a first area of single-level cells (SLCs) and a second area of multi-level cells (MLCs). The device determines whether a free block can be created by copying data between memory blocks of the first area. Upon determining that the free memory block can be created by copying data between the memory blocks of the first area, the device copies the data between the memory blocks of the first area to create the free memory block. Otherwise, the device selects at least one memory block from the first area and allocates the selected memory block as free memory block by copying the data stored in the selected memory block of the first area to the second area.

14 Claims, 12 Drawing Sheets

(56) References Cited

U.S. PATENT DOCUMENTS

| | | | |
|---|---|---|---|
| 2002/0194503 A1 | 12/2002 | Faith et al. | |
| 2007/0283081 A1* | 12/2007 | Lasser | G06F 12/0246 711/103 |
| 2008/0189490 A1* | 8/2008 | Cheon et al. | 711/144 |
| 2009/0222618 A1* | 9/2009 | Cho | 711/103 |
| 2010/0023681 A1* | 1/2010 | Sinclair | G06F 3/061 711/103 |
| 2010/0172179 A1* | 7/2010 | Gorobets | G06F 12/0246 365/185.09 |
| 2011/0029715 A1* | 2/2011 | Hu et al. | 711/103 |
| 2011/0029749 A1 | 2/2011 | Yang et al. | |
| 2011/0145475 A1* | 6/2011 | Eleftheriou | G06F 12/0246 711/103 |
| 2011/0162085 A1* | 6/2011 | Nagasaki | 726/28 |
| 2011/0296087 A1* | 12/2011 | Kim | G06F 12/0246 711/103 |
| 2012/0079167 A1* | 3/2012 | Yao et al. | 711/103 |
| 2012/0246391 A1* | 9/2012 | Meir et al. | 711/103 |
| 2012/0246397 A1* | 9/2012 | Nakai et al. | 711/103 |
| 2012/0254574 A1* | 10/2012 | Sinclair | G11C 11/5628 711/165 |
| 2012/0297122 A1* | 11/2012 | Gorobets et al. | 711/103 |
| 2012/0311293 A1* | 12/2012 | Nemazie | G11C 16/0483 711/171 |
| 2013/0019057 A1* | 1/2013 | Stephens | G06F 11/108 711/103 |
| 2013/0124787 A1* | 5/2013 | Schuette | G06F 12/0246 711/103 |
| 2013/0173844 A1* | 7/2013 | Chen et al. | 711/103 |
| 2013/0275660 A1* | 10/2013 | Bennett | 711/103 |
| 2013/0282955 A1* | 10/2013 | Parker | G06F 12/0246 711/103 |
| 2014/0156921 A1* | 6/2014 | Schuette | G06F 3/0616 711/103 |
| 2014/0244903 A1* | 8/2014 | Yano | G06F 12/0246 711/103 |

FOREIGN PATENT DOCUMENTS

| | | |
|---|---|---|
| KR | 2011-0072205 | 6/2011 |
| WO | WO 2007-128005 | 11/2007 |

* cited by examiner

DEVICES AND METHODS OF MANAGING NONVOLATILE MEMORY DEVICE HAVING SINGLE-LEVEL CELL AND MULTI-LEVEL CELL AREAS

CROSS-REFERENCE TO RELATED APPLICATIONS

This application claims priority under 35 U.S.C. §119 to Korean Patent Application No. 10-2012-0071372 filed on Jun. 29, 2012, the subject matter of which is hereby incorporated by reference.

BACKGROUND OF THE INVENTION

The inventive concept relates generally to electronic memory technologies. More particularly, certain embodiments of the inventive concept relate to nonvolatile memory devices and methods of performing garbage collection in nonvolatile memory devices.

A nonvolatile memory device is a type of memory device capable of retaining stored data even in the absence of applied power. Examples of nonvolatile memory devices include flash memory, resistive random access memory, and phase change random access memory, to name but a few.

In some nonvolatile memory devices, such as flash memory, data cannot be overwritten in place. In other words, any stored data must first be erased before new data can be written. Unfortunately, this tends to increase the computational cost of data management because, for instance, some un-erased memory locations may be occupied by invalid data. The invalid data is generally erased at some point in order to free up those memory locations. In general, a process for erasing or otherwise handling invalid data is referred to as garbage collection. Because the presence of invalid data can influence memory performance, there is a general need for techniques that can efficiently manage invalid data.

SUMMARY OF THE INVENTION

In one embodiment of the inventive concept, a method is provided for managing a nonvolatile memory device comprising a first area of single-level cells (SLCs) and a second area of multi-level cells (MLCs). The method comprises determining whether a free block can be created by copying data between memory blocks of the first area, upon determining that the free memory block can be created by copying data between the memory blocks of the first area, copying the data between the memory blocks of the first area to create the free memory block, and upon determining that the free memory block cannot be created by copying data between the memory blocks of the first area, selecting at least one memory block from the first area and allocating the selected memory block as free memory block by copying the data stored in the selected memory block of the first area to the second area.

In another embodiment of the inventive concept, a nonvolatile memory device comprises a nonvolatile memory comprising a first area of SLCs and a second area of multi-level cells MLCs, and a processor configured to manage operations for generating a free memory block by determining whether the free memory block can be created by copying data between memory blocks of the first area, upon determining that the free memory block can be created by copying data between the memory blocks of the first area, copying the data between the memory blocks of the first area to create the free memory block, and upon determining that the free memory block cannot be created by copying data between the memory blocks of the first area, selecting at least one memory block from the first area and allocating the selected memory block as free memory block by copying the data stored in the selected memory block of the first area to the second area.

In another embodiment of the inventive concept, a method is provided for managing a nonvolatile memory device comprising a first area of SLCs and a second area of MLCs. The method comprises determining whether a free block can be generated by copying data between memory blocks of the first area, and generating the free block by copying data between memory blocks of the first area or between at least one memory block of the first area and at least one memory block of the second area based on the determination.

These and other embodiments of the inventive concept can potentially improve memory performance by reducing the number of accesses to MLC memory blocks, which tend to be slower than SLC memory blocks.

BRIEF DESCRIPTION OF THE DRAWINGS

The drawings illustrate selected embodiments of the inventive concept. In the drawings, like reference numbers indicate like features.

DETAILED DESCRIPTION

Selected embodiments of the inventive concept are described below with reference to the accompanying drawings. These embodiments are presented as teaching examples and should not be construed to limit the scope of the inventive concept.

In certain embodiments described below, an overwrite operation of a nonvolatile memory, such as a flash memory, is not possible due to physical characteristics of memory cells. Thus, where the flash memory receives a request to write new data from an external source, an operation of writing the new data into an empty storage space is performed rather than writing the new data after erasing old data. The operation may be performed by a controller that manages the flash memory, and more particularly, the operation may be implemented as software called a flash translation layer (FTL). The FTL may further include an error correction code (ECC) and/or other operations.

The controller may perform additional operations to address problems such as cell coupling phenomena that may occurs as a density of a flash memory increases. For instance, the controller may perform an operation comprising temporarily storing data to be programmed in a separate storage space, collecting data, and then copying the collected data to a location where the data was to be originally stored, wherein the operation is referred to as a reprogram scheme. Such an operation may be performed on an FTL as embedded software in a flash memory product, such as a secure digital (SD) card.

Figure 1:
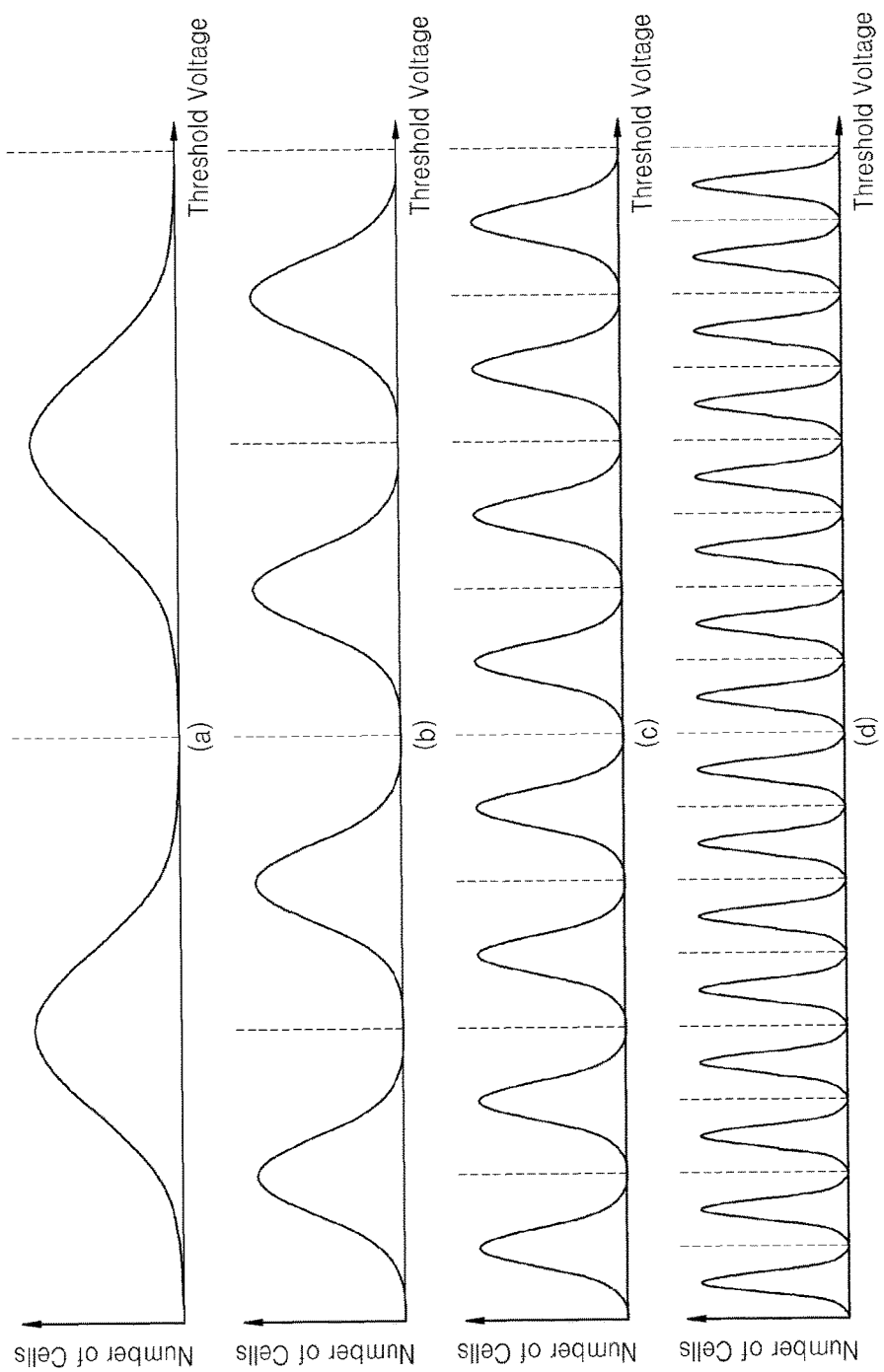
FIG. 1 illustrates a distribution of threshold voltages according to a type of cell in a flash memory.

FIG. 1 illustrates the distribution of threshold voltages according to a type of cell in a flash memory. The cell comprises a floating gate transistor, and a threshold voltage of the transistor is changed by adding or removing electrons from its floating gate. The threshold voltage may be changed or maintained corresponding to data stored in the cell, and the data stored in the cell may be read with the threshold voltage.

Generally, an SLC can store 1-bit data, while a multi-level cell (MLC) can store more than one bit of data by increasing the number of different threshold voltages of a transistor. For example, a 2-bit multi-level cell (MLC) that can store 2-bit data.

A flash memory comprising MLCs can potentially provide increased storage capacity without increasing a complexity of a semiconductor process. However, setting the threshold voltage to an accurate value is necessary to allow detection of different charge levels while not overlapping the distribution of the charges, and a long period of time may be required to accurately write and read the data.

FIG. 1 illustrates a distribution of threshold voltages for an SLC and 2-bit, 3-bit, and 4-bit MLCs. As shown in a graph (a) of FIG. 1, the SLC uses two threshold voltage distributions to store 1-bit data, i.e., a "0" or "1". As shown in a graph (b) of FIG. 1, a 2-bit MLC uses four threshold voltage distributions to store 2-bit data, i.e., "00" through "11". In the same manner, as shown in graphs (c) and (d) of FIG. 1, a 3-bit or 4-bit MLC may have 8 and 16 different threshold voltages, respectively, and accordingly, may store 3- and 4-bit data, respectively. In the description that follows, certain embodiments will be assumed to use 3-bit MLCs, but these and other embodiments are not limited to 3-bit MLCs (or triple level cells (TLCs)) and can include other types of MLCs.

Figure 2:
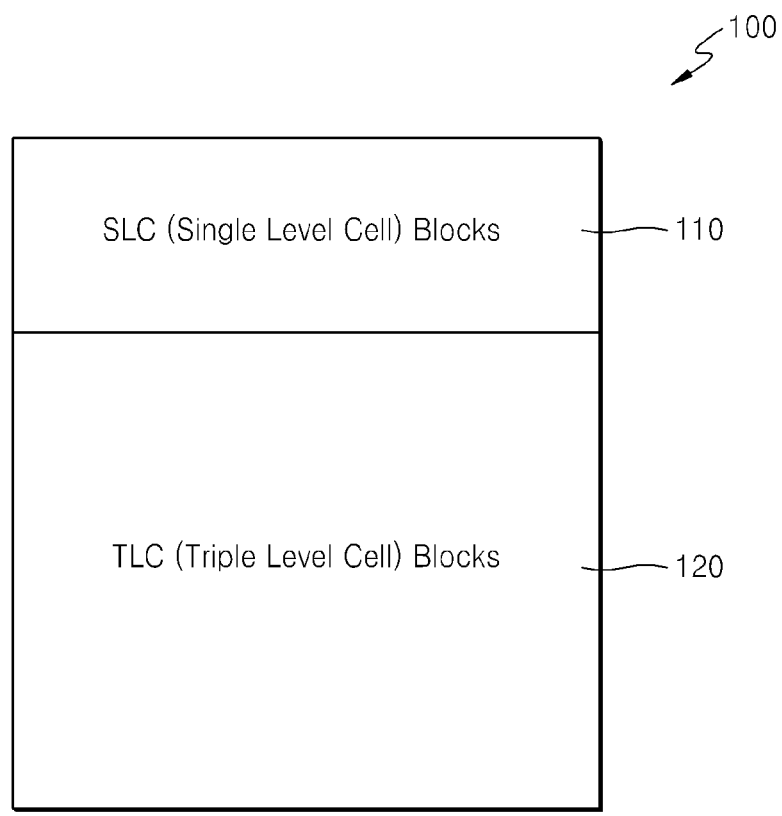
FIG. 2 illustrates a cell array in a flash memory device.

FIG. 2 illustrates a cell array 100 for a flash memory device according to an embodiment of the inventive concept. A controller may manage the flash memory device by writing data into an empty storage space and copying and erasing the data. The cell array may be implemented in various alternative ways, for example, it may include memories such as DRAM, SRAM, or the like, as well as a flash type cell array. Where the cell array is implemented as a flash type cell array, the cell array comprises a first area 110 where each cell stores 1-bit data and a second area 120 where each cell stores multi-bit data. For example, FIG. 2 illustrates an example of cell array 100 including SLCs in first area 110 and TLCs, which store 3-bit data in each cell, in second area 120. first and second areas 110 and 120 are both a flash type cell array where access operations such as writing, reading, and the like are performed in page units, while erasing of the data is performed in memory block units. Each memory block in first and second areas 110 and 120 are referred to as a SLC memory block and a TLC memory block, respectively. As mentioned in the description of FIG. 1, a TLC may store 3-bit data, and thus, data stored in three SLCs may be copied to one TLC.

Figure 3:
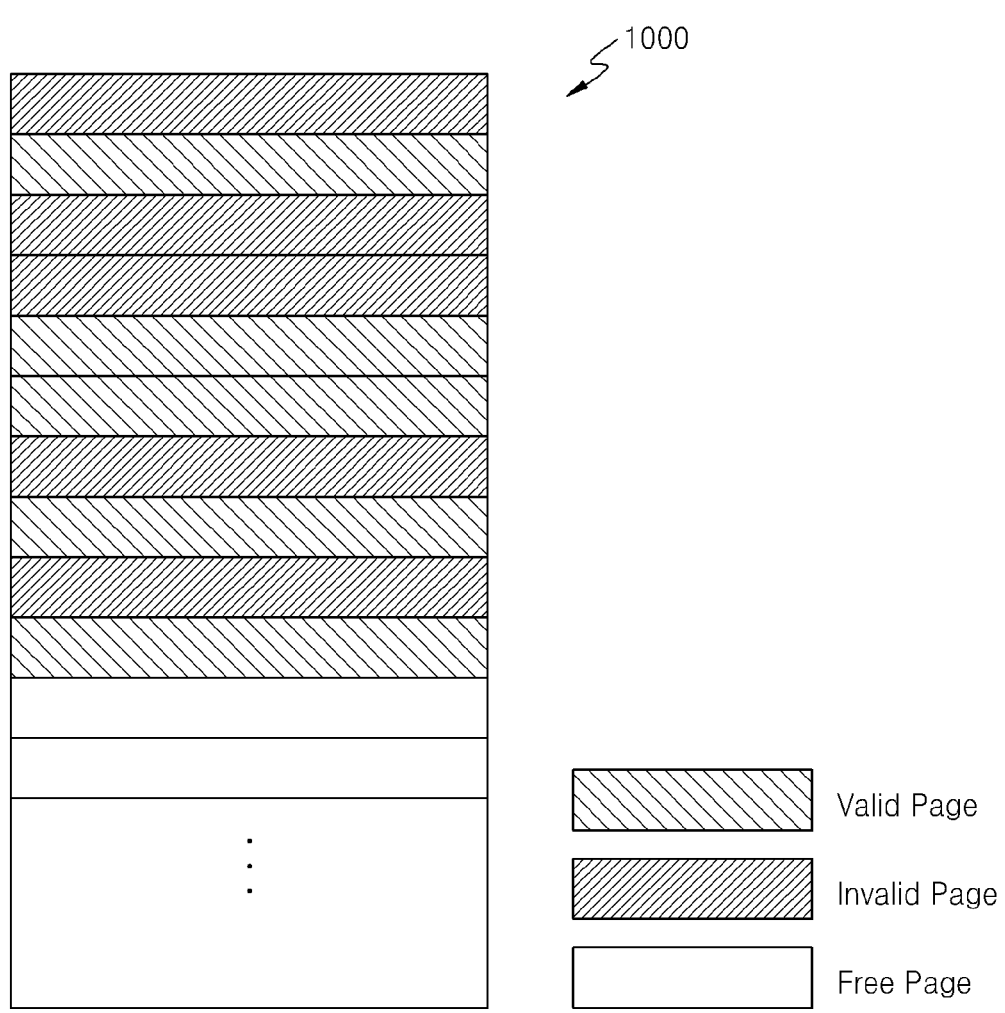
FIG. 3 illustrates a single level cell (SLC) memory block of a flash memory device.

FIG. 3 illustrates an example of an SLC memory block 1000. Where a flash memory device repeatedly receives a request from an external source to write new data to an address already storing data, a controller may write the new data into an empty page, map the address to a new physical location (e.g., in an FTL), and invalidate the data stored at the prior physical location. The new data is referred to as valid data, and the page storing the valid data is referred to as a valid page. Also, the old data is referred to as invalid data, and the page storing the invalid data is referred to as an invalid page. Moreover, a page where data is not stored and thus available to write new data is referred to as a free page.

As shown in FIG. 3, one SLC memory block 1000 comprises a plurality of pages, and each of the pages may be any one of a valid page, an invalid page, and a free page. Also, first area 110 of FIG. 2 comprises at least one SLC memory block 1000 shown in FIG. 3. Where an operation of writing new data into a page of the same location occurs frequently, the number of invalid pages may increase and the number of free pages may decrease. Moreover, where the number of free pages in SLC memory block 1000 is insufficient, the controller may perform an operation to store data in another SLC memory block where a free page is included. Particularly, among the SLC memory blocks, a memory block only including free pages is referred to as a free memory block, and the controller may store data in the free memory block.

Because free memory blocks are consumed as a host writes data into a flash memory device, and because a storage space of a flash memory device is limited, an operation to generate or allocate a free memory block is necessary through an operation of copying valid data stored in a valid page that is included in one or more memory blocks to another memory block and then erasing the memory block storing the old data. These operations constitute a form of garbage collection.

Figure 4:
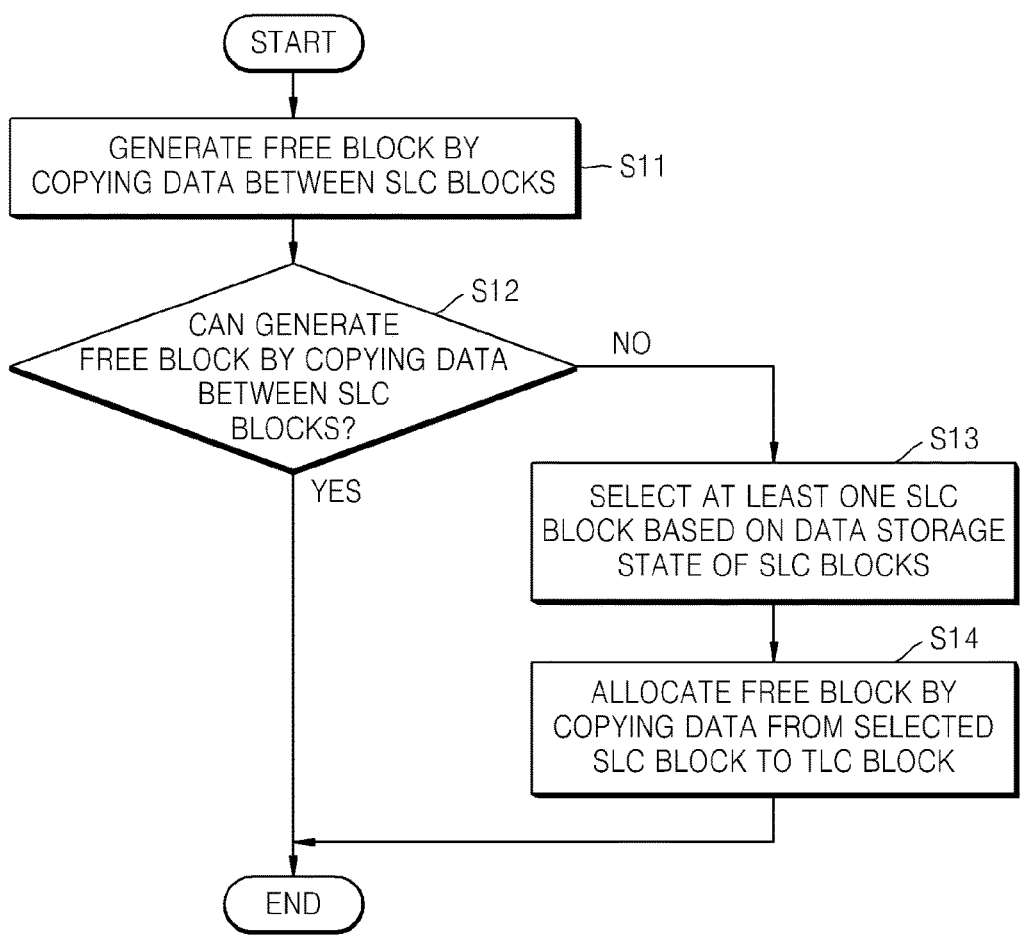
FIG. 4 is a flowchart illustrating a method of managing data in a flash memory device according to an embodiment of the inventive concept.

FIG. 4 is a flowchart illustrating a method of managing a flash memory device according to an embodiment of the inventive concept. In the description that follows, example method features will be indicated by parentheses.

Referring to FIG. 4, where the flash memory device requires a free memory block to complete a requested operation, a controller first attempts to generate a free memory block by copying data between SLC memory blocks (S11). Whether the free memory block is required may be determined according to predetermined conditions. For example, where the number of free memory blocks decreases to a predetermined number or less, or where there are no longer any free memory blocks, a free memory block may be required. In addition, where a controller is in an IDLE state where there is no access to a flash memory device from the outside, a free memory block may be allocated in advance. A method of generating a free memory block by copying data between SLC memory blocks will be described below in greater detail.

Next, the controller determines whether it is possible to generate a free memory block by copying the data between the SLC memory blocks (S12). For example, the controller may select a first SLC memory block including valid pages and a second SLC memory block including free pages. The controller may copy all valid data stored in the valid pages of the first SLC memory block to the free pages of the second SLC memory block. Here, it may be possible that the first or second SLC memory block can not be selected. For example, where there is no SLC memory block having free pages in a number equal to or greater than the number of valid pages of the first SLC memory block, the controller can not select the second SLC memory block.

Accordingly, where the first or second SLC memory block can not be selected, the controller may determine to perform an operation of copying the valid data stored in the SLC memory block to a TLC memory block. That is, the controller may give priority to an operation of copying the valid data between the SLC memory blocks than an operation of copying the valid data from the SLC memory block to the TLC memory block by performing the operation of copying the valid data from the SLC memory block to the TLC memory block only when a free memory block cannot be allocated by copying the valid data between the SLC memory blocks.

Where the valid data is copied from the SLC memory blocks to the TLC memory block even where a free memory block can be generated by copying the valid data between the SLC memory blocks (for example, where the valid data stored in a SLC memory block, including a minimum number of valid pages among the SLC memory blocks, is copied to the TLC memory block), the TLC memory block may be rapidly filled, and as a result, garbage collection may be generated between TLC memory blocks. However, because an operation of copying the valid data between the TLC memory blocks takes longer than the operation of copying the valid data between the SLC memory blocks, the overall performance of the flash memory device may be affected. Therefore, the overall performance of a flash memory device may be improved by giving priority to an operation of transferring valid data between SLC memory blocks to minimize a copy operation of valid data between the SLC memory block and TLC memory block and a garbage collection operation between the TLC memory blocks as described in an embodiment of the inventive concept.

Where it is not possible to generate a free memory block by copying data between the SLC memory blocks (S12=NO), the controller selects at least one SLC memory block to store the data that is to be copied to a TLC memory block based on a data storage state of the SLC memory blocks (S13). For example, the controller may select a SLC memory block having a minimum number of free pages among the SLC memory blocks. An operation of selecting the SLC memory block will be described below in greater detail.

Thereafter, where the valid data stored in the SLC memory block is copied to the TLC memory block, the valid data stored in the SLC memory block is unnecessary duplicate data (S14). Accordingly, the SLC memory block comprises only invalid pages and/or the duplicated valid pages, and thus the controller may erase the SLC memory block. Following erasure of the SLC memory block, the SLC memory block includes only free pages, and as a result, the SLC memory block may be allocated as a free memory block.

Figure 5:
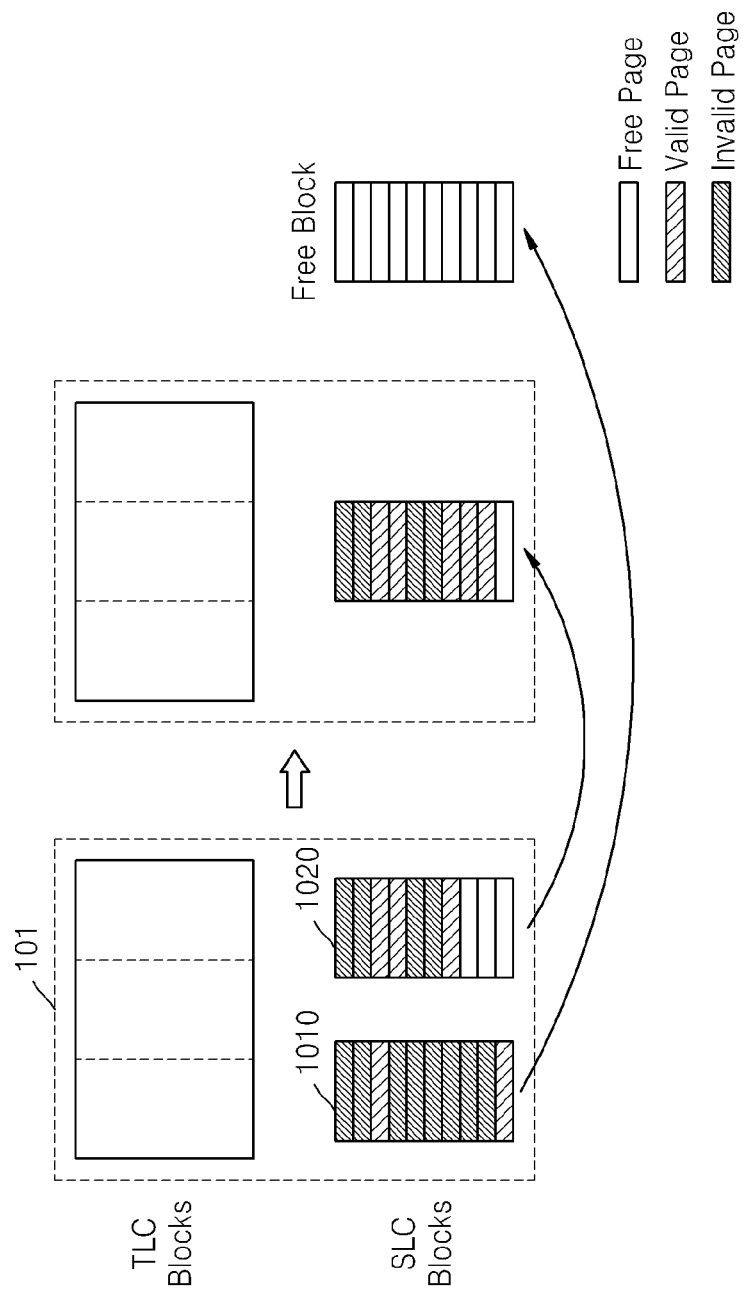
FIG. 5 illustrates an operation for generating a free memory block by copying data between SLC memory blocks according to an embodiment of the inventive concept.
Figure 6:
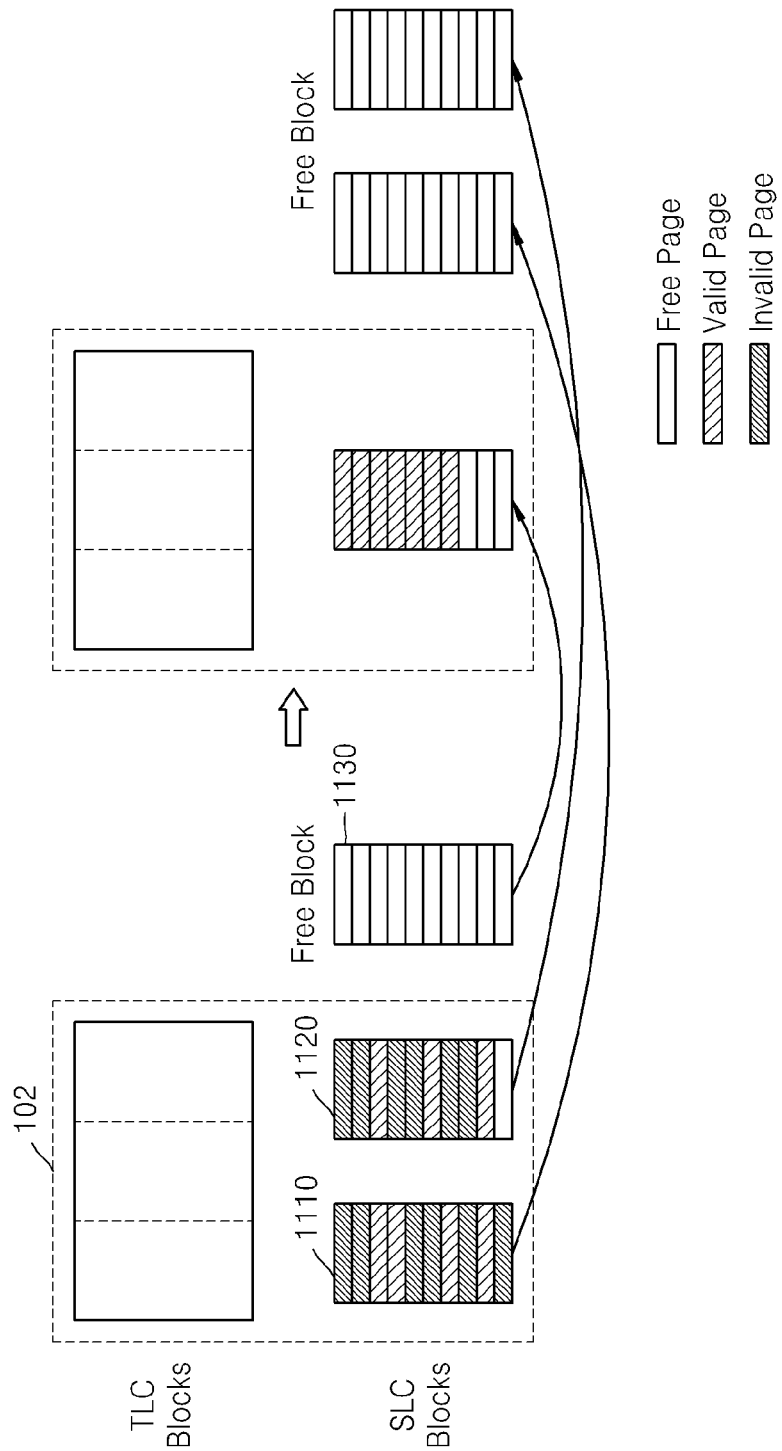
FIG. 6 illustrates an operation for generating a free memory block by copying data between SLC memory blocks according to another embodiment of the inventive concept.

FIGS. 5 and 6 illustrate operations of generating a free memory block or free memory blocks by copying data between SLC memory blocks according to embodiments of the inventive concept. Valid data stored in one or more SLC memory blocks may be copied to another SLC memory block. The SLC memory block receiving and storing the valid data from the other SLC memory blocks may include one or more free pages, or the SLC memory block may be a free memory block only including free pages. FIGS. 5 and 6 illustrate examples of cell arrays including both TLC memory blocks and SLC memory blocks, and a storing unit of data recognized by a host outside the flash memory device may be defined as a unit 101. As shown in FIG. 5, unit 101 comprises TLC memory blocks and SLC memory blocks.

In the example of FIG. 5, a free memory block is generated by copying data between the SLC memory blocks. As shown in FIG. 5, a first SLC memory block 1010 comprises two valid pages, and a second SLC memory block 1020 comprises three valid pages and three free pages. A controller copies valid data that is stored in the two valid pages of first SLC memory block 1010 to the free pages of second memory block 1020. As a result, second memory block 1020 comprises a total of five valid pages and one free page, and first SLC memory block 1010 becomes a free memory block through an erase operation. The controller compares the number of free pages and valid pages when selecting first SLC memory block 1010 and second SLC memory block 1020, and in the current embodiment, the number of free pages of second SLC memory block 1020 is equal to or greater than the number of valid pages of first SLC memory block 1010. The controller selects a memory block with a minimum number of valid pages among a plurality of SLC memory blocks in unit 101 as first SLC memory block 1010 to increase a chance of selecting the second SLC memory block and to minimize an operation of copying valid data.

In the example of FIG. 6 a free memory block is again generated by copying data between SLC memory blocks. As shown in FIG. 6, among three SLC memory blocks, valid data stored in a first SLC memory block 1110 and a second SLC memory block 1120 may be copied to a third SLC memory block 1130. First SLC memory block 1110 and second SLC memory block 1120 include a total of seven valid pages, and third SLC memory block 1130 is a free memory block only including free pages. Although not shown in FIG. 6, third SLC memory block 1130 may comprise a valid page or an invalid page.

A controller copies the valid data stored in the seven valid pages of first SLC memory block 1110 and second SLC memory block 1120 to the free page in third SCL memory block 1130. Then, third SLC memory block 1130 comprises the total of seven valid pages and three free pages, and first memory block 1110 and second SLC memory block 1120 may each become a free memory block through an erase operation. That is, in the example of FIG. 6, the controller consumes one free memory block to produce two free memory blocks. Here, the controller compares the number of valid pages and free pages when selecting first SLC memory block 1110, second SLC memory block 1120, and third SLC memory block 1130. Also, in the example of FIG. 6, the number of valid pages in first SLC memory block 1110 and second SLC memory block 1120 is equal to or less than the number of free pages in third SLC memory block 1130. The controller selects a memory block with a minimum number of valid pages among a plurality of SLC memory blocks as the first SLC memory block, and selects a memory block that has the minimum number of valid pages other than the first SLC memory block as the second SLC memory block. Although not shown in FIG. 6, the number of SLC memory blocks that store valid data being copied may be three or more.

Figure 7:
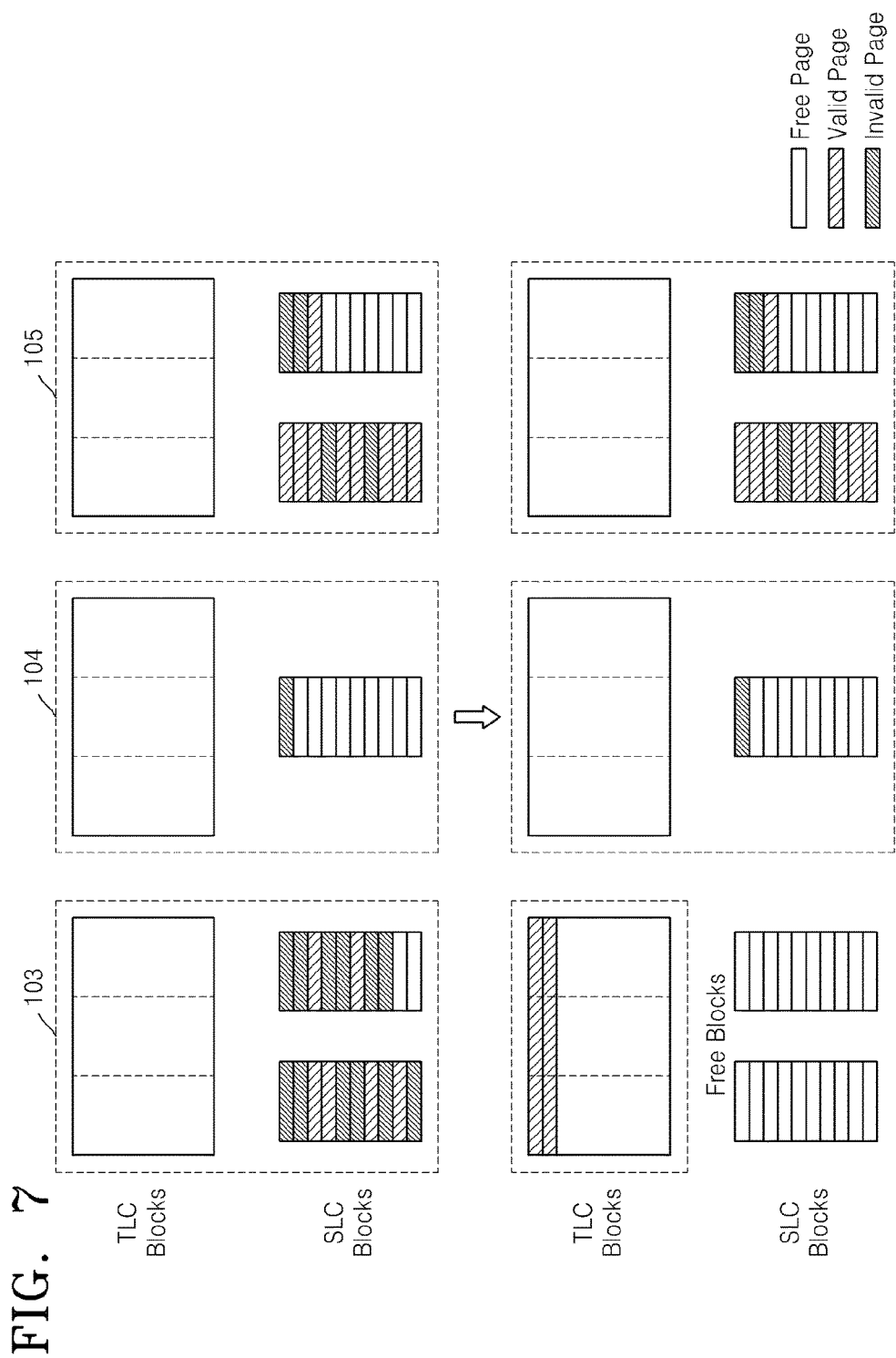
FIG. 7 illustrates an operation for allocating free memory blocks by using SLC memory blocks and triple-level cell (TLC) memory blocks according to an embodiment of the inventive concept.

FIG. 7 illustrates an operation of allocating free memory blocks by using SLC memory blocks and TLC memory blocks, according to an embodiment of the inventive concept. A controller copies valid data from SLC memory blocks to a TLC memory block to allocate at least one SLC memory block to a free memory block when a free memory block may not be selected by copying valid data between the SLC memory blocks. Here, the controller selects SLC memory blocks storing the valid data to be copied to the TLC memory blocks. As shown in FIG. 7, the SLC memory blocks are included in a unit, and thus an operation of copying valid data between the TLC memory blocks and the SLC memory blocks in the same unit can be performed. Thus, selecting the SLC memory blocks may indicate selecting the unit including the SLC memory blocks, and the selected unit is referred to as a victim unit.

As shown in FIG. 7, where three units are included in a flash memory device, a victim unit may be selected by the controller as conditions where a free memory block is necessary are satisfied. In some embodiments, the controller selects a victim unit that has a minimum number of free pages in the SLC memory blocks in each of the units. For example, the SLC memory blocks of a first unit 103, a second unit 104, and a third unit 105 may include two, nine, and seven free pages, respectively, and first unit 103 where a SLC memory block including a minimum number of free pages is included may be selected as a victim unit.

It may be more efficient for the controller to select first unit 103 than selecting second unit 104, which is a memory block that has a minimum number of valid pages to minimize a copy operation of valid data. That is because, if an SLC memory block has a minimum number of valid pages and has many free pages at the same time as in second unit 104, the SLC memory block is allocated to a free memory block in advance even though the SLC memory block still has a sufficient space for storing new data. That is, selecting first unit 103 with a high chance of needing a free memory block later as the unit lacks free pages to allocate the SLC memory blocks in first unit 103 to free memory blocks as in an embodiment of the inventive concept may be more efficient than selecting a unit with a minimum number of valid pages.

Where first unit 103 shown in FIG. 7 is selected as a victim unit, the controller copies the valid data stored in the valid pages of the SLC memory blocks in first unit 103 to the TLC memory block, and the SLC memory blocks in first unit 103 may be erased and then allocated to free memory blocks. The free memory blocks may be used for all units in the flash memory device.

Figure 8:
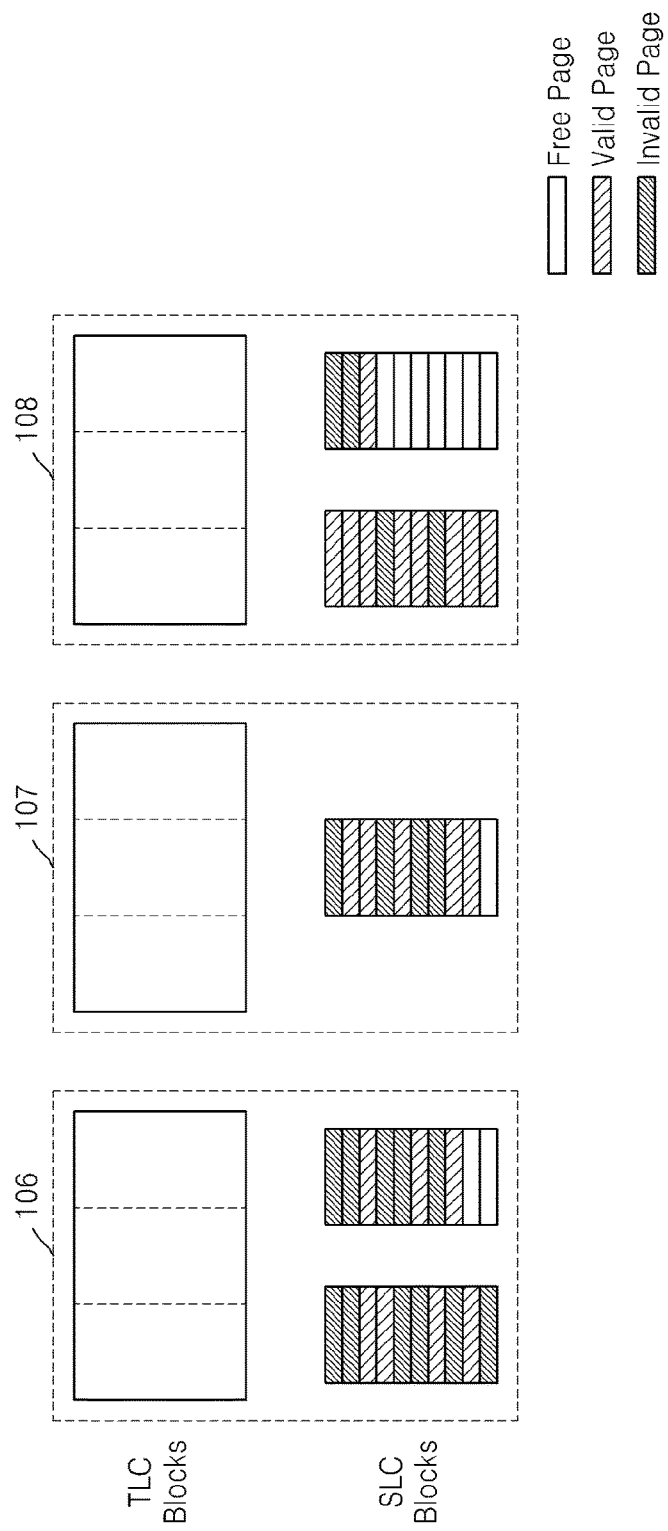
FIG. 8 illustrates an operation for selecting a SLC memory block storing data to be copied to a TLC memory block according to an embodiment of the inventive concept.

FIG. 8 illustrates an operation for selecting a SLC memory block storing data to be copied to a TLC memory block according to an embodiment of the inventive concept. The operation of generating a free memory block by copying the data between the SLC memory blocks, as stated above, may affect an operation of selecting a victim unit. For example, as shown in FIG. 8, the SLC memory blocks of a first unit 106, a second unit 107, and a third unit 108 may include two, one, and seven free pages, respectively. In the example of FIG. 7 described above, regarding an operation of generating free memory blocks by copying the data between the SLC memory blocks including the minimum number of free pages, second unit 107 may not generate a free memory block by copying the data between the SLC memory blocks regardless of a data storage state of the SLC memory block because second unit 107 only comprises one SLC memory block. In some embodiments, however, the controller may select a victim unit among first unit 106 and third unit 108 even though second unit 107 comprises the SLC memory block that has a minimum number of free pages. In this regard, first unit 106 with a lower number of free pages among first unit 106 and third unit 108 may be selected as a victim unit, and the controller may copy the valid data stored in the SLC memory blocks to the TLC memory block and then allocate the SLC memory blocks to free memory blocks through an erase operation in the same manner as shown in FIG. 7.

Figure 9:
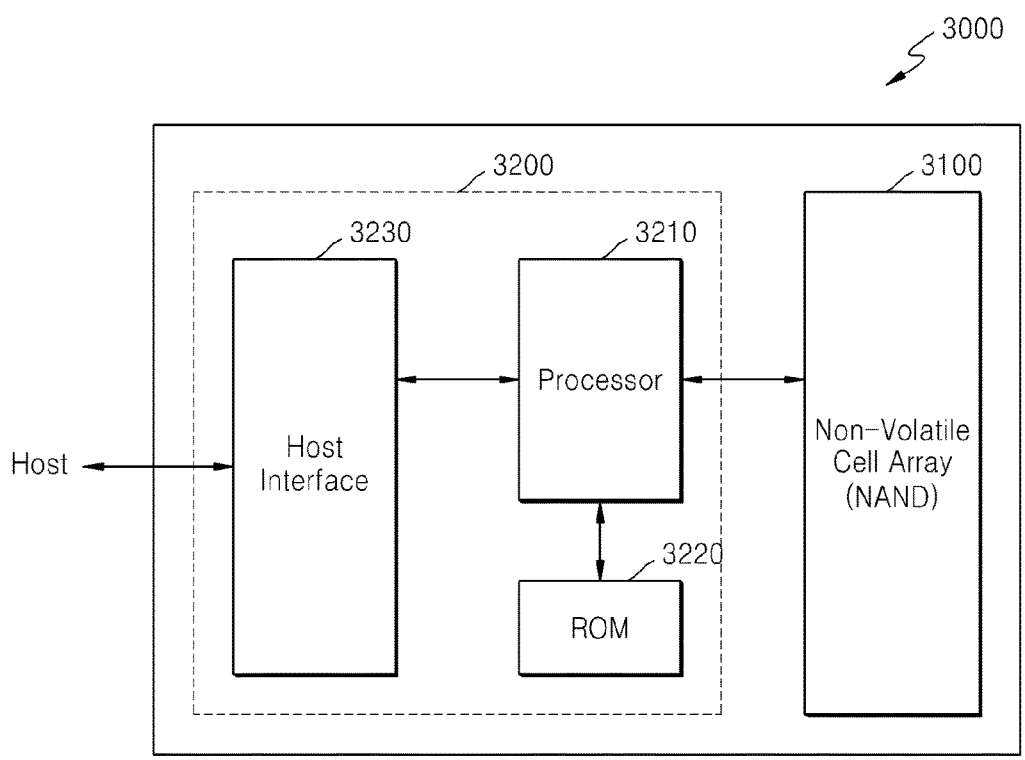
FIG. 9 illustrates a nonvolatile memory device according to an embodiment of the inventive concept.

FIG. 9 is a block diagram illustrating a nonvolatile memory device 3000 according to an embodiment of the inventive concept. Nonvolatile memory device 3000 performs writing, storing, and reading functions by communicating with an external host. At least one of the methods described above may be performed by nonvolatile memory device 3000. Nonvolatile memory device 3000 comprises a nonvolatile cell array 3100 storing data, a ROM 3220 where programs are stored, a processor 3210 for managing a nonvolatile memory device by performing the programs, and a host interface 3230 for transmitting and receiving signals with the external host. A controller 3200 managing the nonvolatile cell array 3100 may include processor 3210, ROM 3220, and host interface 3230.

Instructions for performing a method of managing nonvolatile memory device 3000 may be stored in ROM 3220 as software, for example. Processor 3210 may perform the programs stored in ROM 3220 to implement the method of managing nonvolatile memory device 3000, and the programs may include a FTL. Host interface 3230 receives commands and addresses from the host and transmits the commands and addresses to other features of nonvolatile memory device 3000, or host interface 3230 receives signals from the other features and transmits the signals to the host.

Nonvolatile cell array 3100 typically comprises a cell array such as a NAND flash memory, a NOR flash memory, or the like. In some embodiments, nonvolatile cell array 3100 comprises a SLC area and a TLC area as shown in FIG. 2 and is controlled by processor 3210. Cells storing multiple bits of data (e.g., 2-bit or 4-bit MLCs) as well as TLCs may be included in the nonvolatile cell array 3100.

Figure 10:
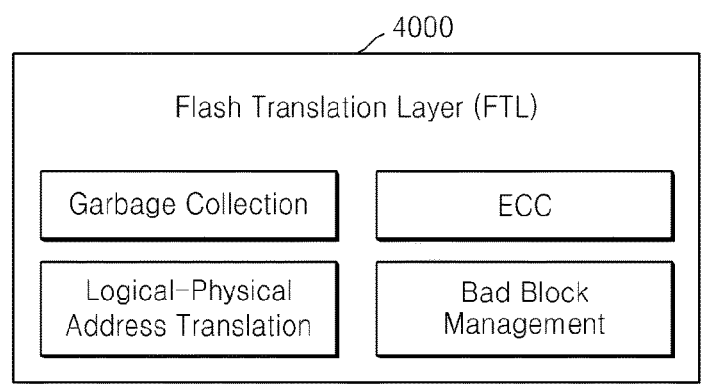
FIG. 10 is a block diagram illustrating a structure of a flash translation layer for managing a flash memory device according to an embodiment of the inventive concept.

FIG. 10 is a block diagram illustrating a structure of a FTL 4000 for managing a flash memory device, according to an embodiment of the inventive concept. FTL 4000 may be embedded software in the flash memory device, for example. FTL 4000 may perform garbage collection as described in connection with other embodiments above. Also, FTL 4000 may further comprise ECC, logical-physical address translation, and bad memory block management, for example.

Figure 11:
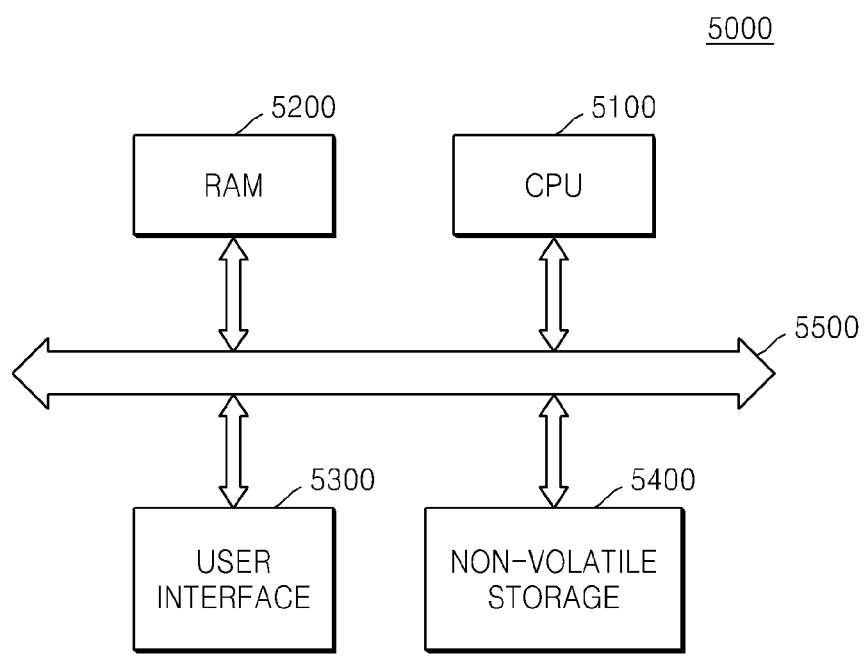
FIG. 11 is a block diagram illustrating a computing system comprising a nonvolatile memory device according to an embodiment of the inventive concept.

FIG. 11 is a block diagram illustrating a computing system 5000 comprising a nonvolatile memory device according to an embodiment of the inventive concept. The nonvolatile memory device can be attached to computing system 5000, such as a mobile device or a desktop computer, as a nonvolatile storage device 5400. The nonvolatile memory device can be implemented as described above in relation to various embodiments.

Referring to FIG. 11, computing system 5000 comprises a central processing unit (CPU) 5100, a RAM 5200, a user interface 5300, and nonvolatile storage device 5400. these features are electrically connected to each other via a bus 5500. In computing system 5000, nonvolatile storage device 5400 comprises a nonvolatile memory device for storing data, and the nonvolatile memory device comprises a nonvolatile cell array or a controller for managing the nonvolatile cell array. The controller can be used to perform a method of managing a nonvolatile memory device as described above in relation to various embodiments. The nonvolatile cell array in nonvolatile storage device 5400 may comprise, for instance, a cell array such as a NAND flash memory, a NOR flash memory, or the like.

Figure 12:
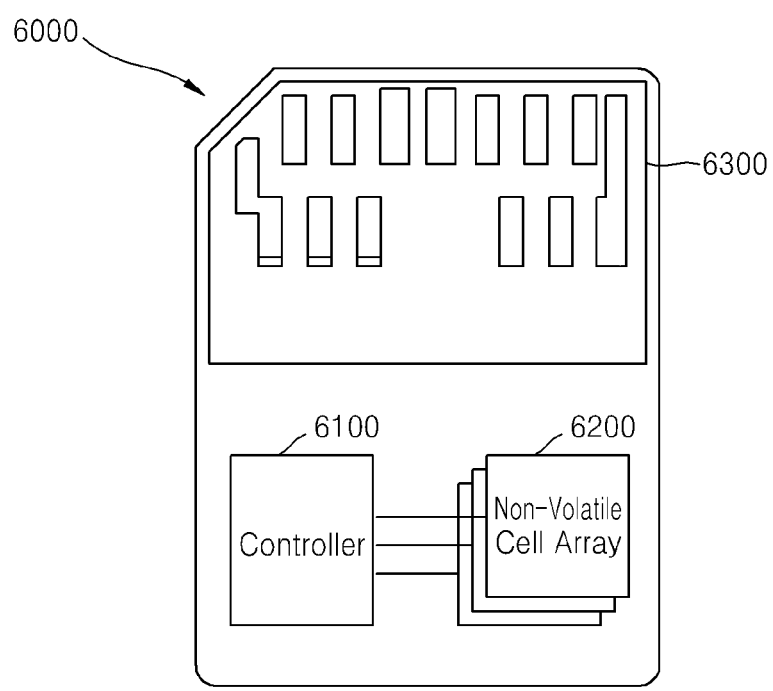
FIG. 12 illustrates a memory card according to an embodiment of the inventive concept.

FIG. 12 illustrates a memory card 6000 according to an embodiment of the inventive concept. Memory card 6000 is a portable storage device that can be used by connecting to an electronic device, such as a mobile device or a desktop computer. As shown in FIG. 12, memory card 6000 comprises a controller 6100, a nonvolatile cell array 6200, and a port area 6300.

Memory card 6000 communicates with an external host (not shown) through port area 6300, and controller 6100 controls nonvolatile cell array 6200. Controller 6100 performs a program by reading the program from a ROM (not shown) storing programs. A method of managing a nonvolatile memory device as described above may be performed by controller 6100. Nonvolatile cell array 6200 may comprise a cell array such as a NAND flash memory or a NOR flash memory, for example.

Figure 13:
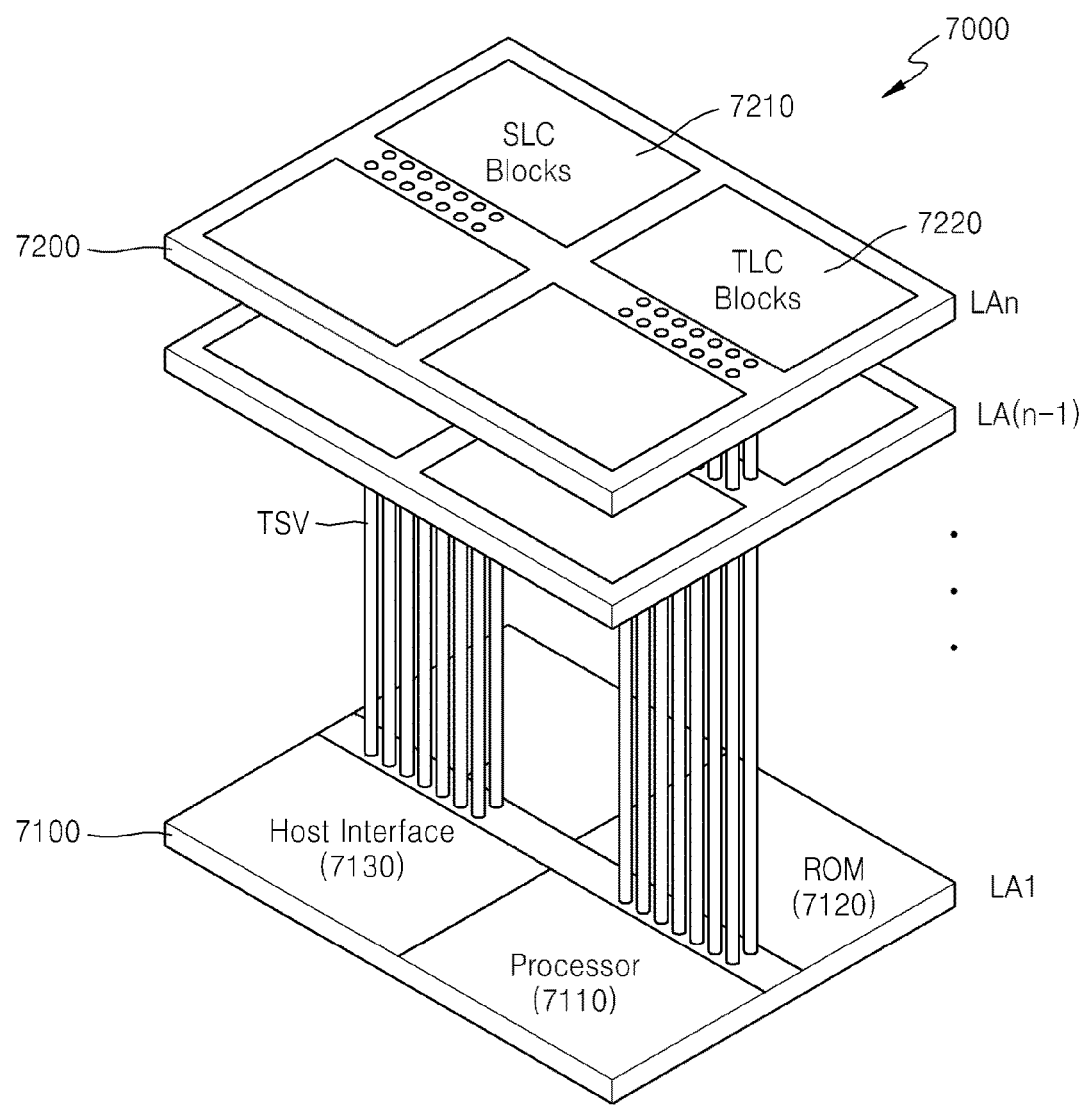
FIG. 13 illustrates a structure of a nonvolatile memory device according to an embodiment of the inventive concept.

FIG. 13 illustrates a structure of a nonvolatile memory device according to an embodiment of the inventive concept. As shown in FIG. 13, the nonvolatile memory device may be implemented as a semiconductor device 7000. Semiconductor device 7000 comprises a plurality of a semiconductor layers LA1 through LAn. Each of semiconductor layers LA1 through LAn may be a nonvolatile memory chip (e.g., a NAND flash memory chip), or some of semiconductor layers LA1 through LAn are master chips interfacing with an external host and the rest of semiconductor layers LA1 through LAn may be slave chips storing data. In the example of FIG. 13, the lowermost semiconductor layer LA1 is assumed to be a master chip, and the rest of semiconductor layers LA2 through LAn are assumed to be slave chips.

Although semiconductor layers LA1 through LAn in FIG. 13 exchange signals with one another via through silicon vias (TSVs), other means (e.g., wires) may be used to exchange signals. A construction and operation of semiconductor device 7000 will be described based on a first semiconductor layer 7100 as a master chip and a n$^{th}$ semiconductor layer 7200 as a slave chip, as follows.

First semiconductor layer 7100 comprises various types of circuits for operating SLC memory blocks 7210 and TLC memory blocks 7220 which are included in the slave chips. For example, first semiconductor layer 7100 may include a ROM 7120 where programs are stored, a processor 7110 for managing a nonvolatile memory device by performing the programs, and a host interface 7130 for transmitting and receiving signals with the external host.

A method of managing nonvolatile memory device 7000, according to an embodiment of the inventive concept, may be stored in ROM 7120 as software. Processor 7110 may perform the programs stored in ROM 7120 to implement the method of managing nonvolatile memory device 7000, and the programs may include a FTL. Host interface 7130 receives commands and addresses from the host and may transmit the command and address to other elements of nonvolatile memory device 7000, or host interface 7130 receives signals from the other elements and may transmit the signals to the host.

In addition, n$^{th}$ semiconductor layer 7200 may include a nonvolatile cell array, and the nonvolatile cell array may include SLCs and TLCs. Although TLC memory blocks 7220 are shown in FIG. 13, the structure is an example, and n$^{th}$ semiconductor layer 7200 may include MLC memory blocks, which may store multiple bits of data in one cell.

In the above description, a flash memory is presented as an example nonvolatile memory, but the inventive concept is not limited thereto. For example, a nonvolatile memory according to an embodiment of the inventive concept could alternatively be a magnetic random access memory (MRAM), a resistance RAM (RRAM), a ferroelectric RAM (FRAM), or a phase change memory (PCM), and in each of the memories, a free memory block may be generated or allocated by a copy operation of data between SLC memory blocks or between SLC memory blocks and MLC blocks.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of managing a nonvolatile memory device comprising a first area of single-level cells (SLCs) and a second area of multi-level cells (MLCs), the method comprising:
   determining, in response to a requirement for a free memory block to be created in the first area, whether the free memory block can be created by copying data between memory blocks of the first area;
   in response to determining that the free memory block can be created by copying data between the memory blocks of the first area, copying the data between the memory blocks of the first area to create the free memory block; and
   in response to determining that the free memory block cannot be created by copying data between the memory blocks of the first area, selecting a memory block from the first area having the least number of free pages among the memory blocks of the first area and allocating the selected memory block as a free memory block by copying the data stored in the selected memory block of the first area to the second area, wherein:
   responsive to the requirement for the free memory block, the data stored in the selected memory block of the first area is copied to the second area only when it is determined that the free memory block cannot be created by copying data between the memory blocks of the first area,
   each of the memory blocks comprises a plurality of pages, wherein each of the pages is a valid page, an invalid page, or a free page.

2. The method of claim 1, wherein the MLCs are 3-bit MLCs.

3. The method of claim 1, wherein creating the free memory block comprises:
   selecting a first memory block and a second memory block, wherein the number of valid pages of the first memory block is equal to or less than the number of free pages of the second memory block; and generating the free memory block by copying the data stored in the valid pages to the free pages.

4. The method of claim 3, wherein the first memory block has the least number of valid pages among the memory blocks of the first area.

5. The method of claim 1, wherein creating the free memory block comprises:
  selecting first through third memory blocks, wherein the number of valid pages in the first and second memory blocks is less than or equal to the number of free pages in the third memory block; and
  generating the free memory block by copying data stored in the valid pages of the first and second memory blocks to the free page of the third memory block.

6. The method of claim 1, wherein the nonvolatile memory device is a NAND flash memory.

7. The method of claim 1, wherein the second area comprises 2-bit multi-level cells.

8. A nonvolatile memory device; comprising:
  a nonvolatile memory comprising a first area of single level cells (SLCs) and a second area of multi-level cells (MLCs); and
  a processor configured to manage operations for generating a free memory block by:
    determining, in response to a requirement for the free memory block, whether the free memory block can be created by copying data between memory blocks of the first area,
    in response to determining that the free memory block can be created by copying data between the memory blocks of the first area, copying the data between the memory blocks of the first area to create the free memory block, and
    in response to determining that the free memory block cannot be created by copying data between the memory blocks of the first area, selecting a memory block from the first area having the least amount of free space, where no data is stored, among the memory blocks of the first area and allocating the selected memory block as the free memory block by copying the data stored in the selected memory block of the first area to the second area, wherein:
  when copying data between memory blocks of the first area, the processor is configured to:
    create the free memory block by selecting first through third memory blocks from among the first area, wherein the number of valid pages in the first and second memory blocks is less than or equal to the number of free pages in the third memory block, and
    generate the free memory block by copying data stored in the valid pages of the first and second memory blocks to the free pages of the third memory block, and
  the processor, responsive to the requirement for the free memory block, copies the data stored in the selected memory block of the first area to the second area only when it is determined that the free memory block cannot be created by copying data between the memory blocks of the first area.

9. The nonvolatile memory device of claim 8, wherein the second area comprises 3-bit MLCs.

10. The nonvolatile memory device of claim 8, wherein the processor comprises a flash translation layer (FTL), wherein the FTL operates to generate or allocate the free memory block.

11. The nonvolatile memory device of claim 8, wherein the second area comprises 2-bit MLCs.

12. A method of managing a nonvolatile memory device comprising a first area of single-level cells (SLCs) and a second area of multi-level cells (MLCs), the method comprising:
  determining, in response to a requirement for a free memory block to be created in the first area, whether first and second memory blocks can be selected from among memory blocks within the first area in which the number of valid pages of the first memory block is equal to or less than the number of free pages of the second memory block; and
  generating the free memory block by copying data between the first and second memory blocks of the first area in response to determining that the first and second memory blocks can be selected;
  generating the free memory block by copying data from a selected memory block of the first area to a selected memory block of the second area in response to determining that the first and second memory blocks cannot be selected, wherein:
  in response to the requirement for the free memory block, the data is copied from the selected memory block of the first area to the selected memory block of the second area only when it is determined that the first and second memory blocks cannot be selected, and
  the selected memory block of the first area has the least number of free pages of any memory block within the first area.

13. The method of claim 12, further comprising erasing the selected memory block of the first area after copying data from the selected memory block of the first area to the selected memory block of the second area.

14. The method of claim 12, further comprising updating a flash translation layer (FTL) to reflect the generation of the free memory block.

* * * * *